United States Patent
Iwamiya et al.

(10) Patent No.: US 8,014,161 B2
(45) Date of Patent: Sep. 6, 2011

(54) COMMUNICATION DEVICE AND ELECTRONIC APPARATUS USING THE SAME

(75) Inventors: Hiroki Iwamiya, Osaka (JP); Yukio Sakai, Hyogo (JP); Yuji Osumi, Nara (JP)

(73) Assignee: Panasonic Corporation, Osaka (JP)

( * ) Notice: Subject to any disclaimer, the term of this patent is extended or adjusted under 35 U.S.C. 154(b) by 474 days.

(21) Appl. No.: 12/373,154

(22) PCT Filed: Jun. 8, 2007

(86) PCT No.: PCT/JP2007/061599
§ 371 (c)(1),
(2), (4) Date: Jan. 9, 2009

(87) PCT Pub. No.: WO2008/010359
PCT Pub. Date: Jan. 24, 2008

(65) Prior Publication Data
US 2009/0290315 A1 Nov. 26, 2009

(30) Foreign Application Priority Data
Jul. 20, 2006 (JP) .................. 2006-197903

(51) Int. Cl.
*H05K 7/00* (2006.01)

(52) U.S. Cl. ..................................... 361/753

(58) Field of Classification Search .......... 361/753, 361/794, 780, 799, 800
See application file for complete search history.

(56) References Cited

U.S. PATENT DOCUMENTS

| 4,449,174 | A | * | 5/1984 | Ziesse ........................... 323/282 |
| 4,480,240 | A | * | 10/1984 | Gould ........................... 361/753 |
| 4,612,512 | A | * | 9/1986 | Powell et al. ................... 330/66 |
| 5,500,789 | A | * | 3/1996 | Miller et al. .................. 361/816 |
| 5,510,758 | A | * | 4/1996 | Fujita et al. ................... 361/795 |
| 5,912,809 | A | * | 6/1999 | Steigerwald et al. .......... 361/780 |
| 6,150,895 | A | * | 11/2000 | Steigerwald et al. .......... 361/818 |
| 6,337,798 | B1 | * | 1/2002 | Hailey et al. .................. 361/763 |
| 6,885,035 | B2 | * | 4/2005 | Bhat et al. ....................... 257/99 |
| 7,438,560 | B2 | * | 10/2008 | Takahashi ..................... 361/792 |
| 7,515,436 | B2 | * | 4/2009 | Shinoda et al. ............... 361/794 |
| 7,679,005 | B2 | * | 3/2010 | Chan et al. .................... 361/792 |
| 2003/0063453 | A1 | * | 4/2003 | Kusagaya et al. ............. 361/794 |
| 2005/0201072 | A1 | * | 9/2005 | He et al. ........................ 361/794 |
| 2006/0291178 | A1 | * | 12/2006 | Shih ............................... 361/780 |
| 2007/0284140 | A1 | * | 12/2007 | Danoski et al. ............... 361/794 |

FOREIGN PATENT DOCUMENTS

| JP | 09-083233 A | 3/1997 |
| JP | 11-145570 A | 5/1999 |
| JP | 2001-313443 A | 11/2001 |
| JP | 2002-077338 A | 3/2002 |
| JP | 2003-101283 A | 4/2003 |
| JP | 2005-341489 A | 12/2005 |
| JP | 2006-121147 A | 5/2006 |

OTHER PUBLICATIONS

International Search Report for PCT/JP2007/061599, Jul. 31, 2007.

* cited by examiner

*Primary Examiner* — Lisa Lea Edmonds
(74) *Attorney, Agent, or Firm* — Pearne & Gordon LLP

(57) ABSTRACT

In a communication device, a ground plane disposed on the upper or lower surface of a board or inside the board includes a first ground region disposed on a semiconductor circuit and connected thereto, and a second ground region disposed under an amplifier and connected thereto. The first ground region and the second ground region do not overlap with each other.

8 Claims, 7 Drawing Sheets

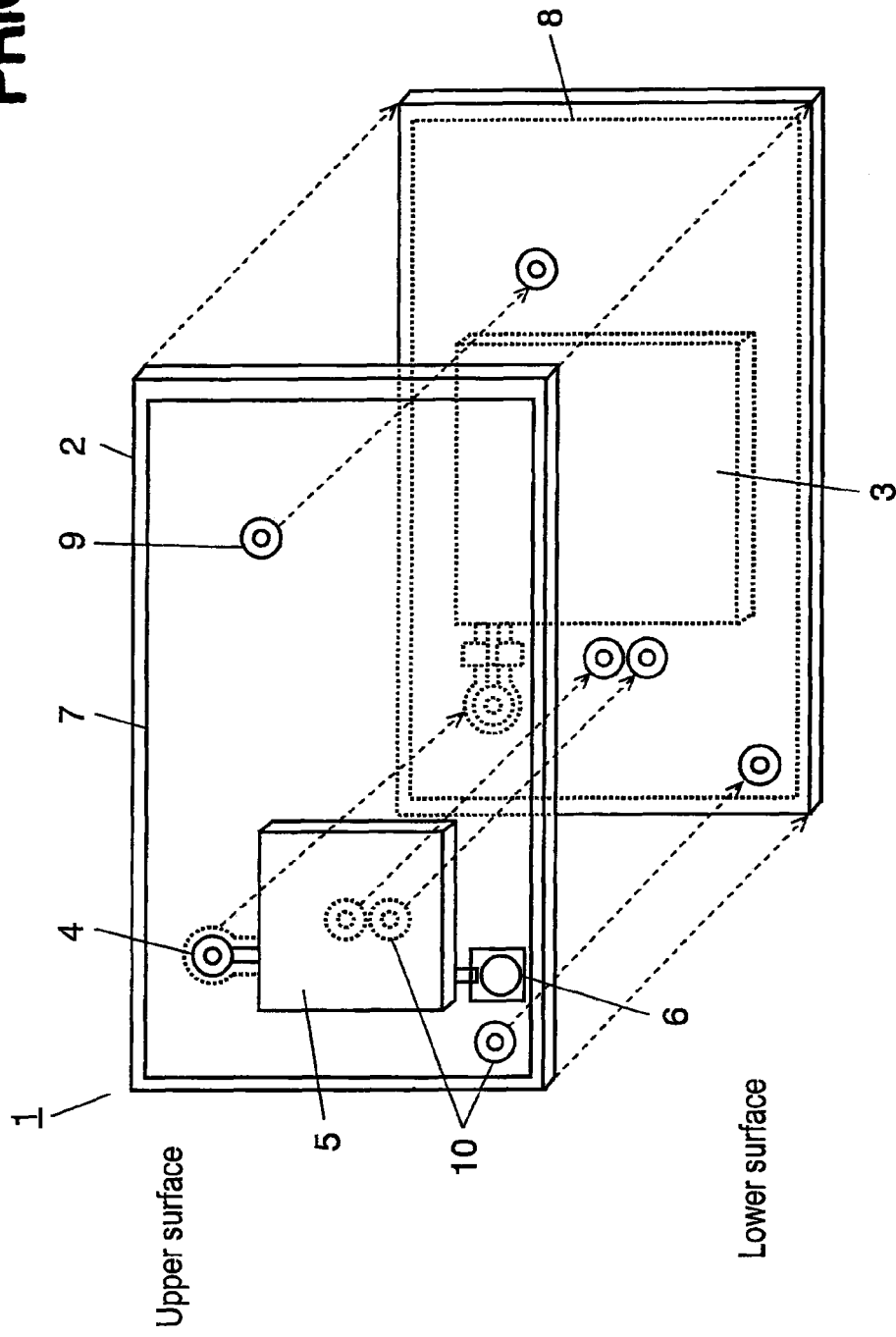

COMMUNICATION DEVICE AND ELECTRONIC APPARATUS USING THE SAME

This Application is a U.S. National Phase Application of PCT International Application Pct/JP2007/061599.

TECHNICAL FIELD

The present invention relates to a communication device for wireless LAN or other wireless communications and an electronic apparatus using the device.

BACKGROUND ART

A conventional communication device is described as follows with reference to FIG. 7.

FIG. 7 is a view of upper and lower surfaces of a conventional communication device. In FIG. 7, communication device 1 includes board 2 and semiconductor circuit 3 for generating signals. Semiconductor circuit 3 is disposed on the lower surface of board 2 and connected to board 2 through via 4, which is placed on the upper surface of board 2 and formed in board 2. Communication device 1 further includes amplifier 5 and antenna terminal 6. Amplifier 5 is connected to the output of semiconductor circuit 3. Antenna terminal 6 is connected to amplifier 5.

Communication device 1 further includes ground planes 7 and 8. Ground plane 7 is disposed on the lower surface of board 2 and connected to amplifier 5. Ground plane 8 is disposed inside board 2 and connected to semiconductor circuit 3. Ground planes 7 and 8 are connected to each other through ground via 9, and further connected to amplifier 5 through thermal vias 10 for radiating amplifier 5.

An example of a conventional technique related to the present invention is shown in Patent Document 1.

In conventional communication device 1, the region in which amplifier 5 is located and the region in which semiconductor circuit 3 is located partially overlap with each other. This makes a large number of signal lines of semiconductor circuit 3 hinder providing a sufficient number of thermal vias 10 to be connected to amplifier 5. As a result, floating inductance tends to occur between amplifier 5 and ground planes 7, 8, thereby being more likely to cause abnormal oscillation of amplifier 5.

Patent Document 1: Japanese Patent Unexamined Publication No. 2006-121147

SUMMARY OF THE INVENTION

The present invention reduces abnormal oscillation of an amplifier.

The communication device of the present invention includes a board, a ground plane, a semiconductor circuit, and an amplifier. The ground plane is disposed on the upper or lower surface of the board or inside the board. The semiconductor circuit is disposed under the board and generates transmission signals. The amplifier is disposed on the board and amplifies transmission signals received from the semiconductor circuit. The ground plane includes a first ground region disposed on the semiconductor circuit and connected thereto, and a second ground region disposed under the amplifier and connected thereto. When viewed from above, the first ground region and the second ground region do not overlap with each other.

With this structure, the first ground region connected to the semiconductor circuit and the second ground region connected to the amplifier are separated from each other. This ensures a sufficient number of thermal vias to be connected to the amplifier without being hindered by signal lines of the semiconductor circuit. As a result, there is little floating inductance between the amplifier and the ground plane, thereby reducing abnormal oscillation of the amplifier.

BRIEF DESCRIPTION OF THE DRAWINGS

FIG. 7 is a view of upper and lower surfaces of a conventional communication device.

Figure 1:
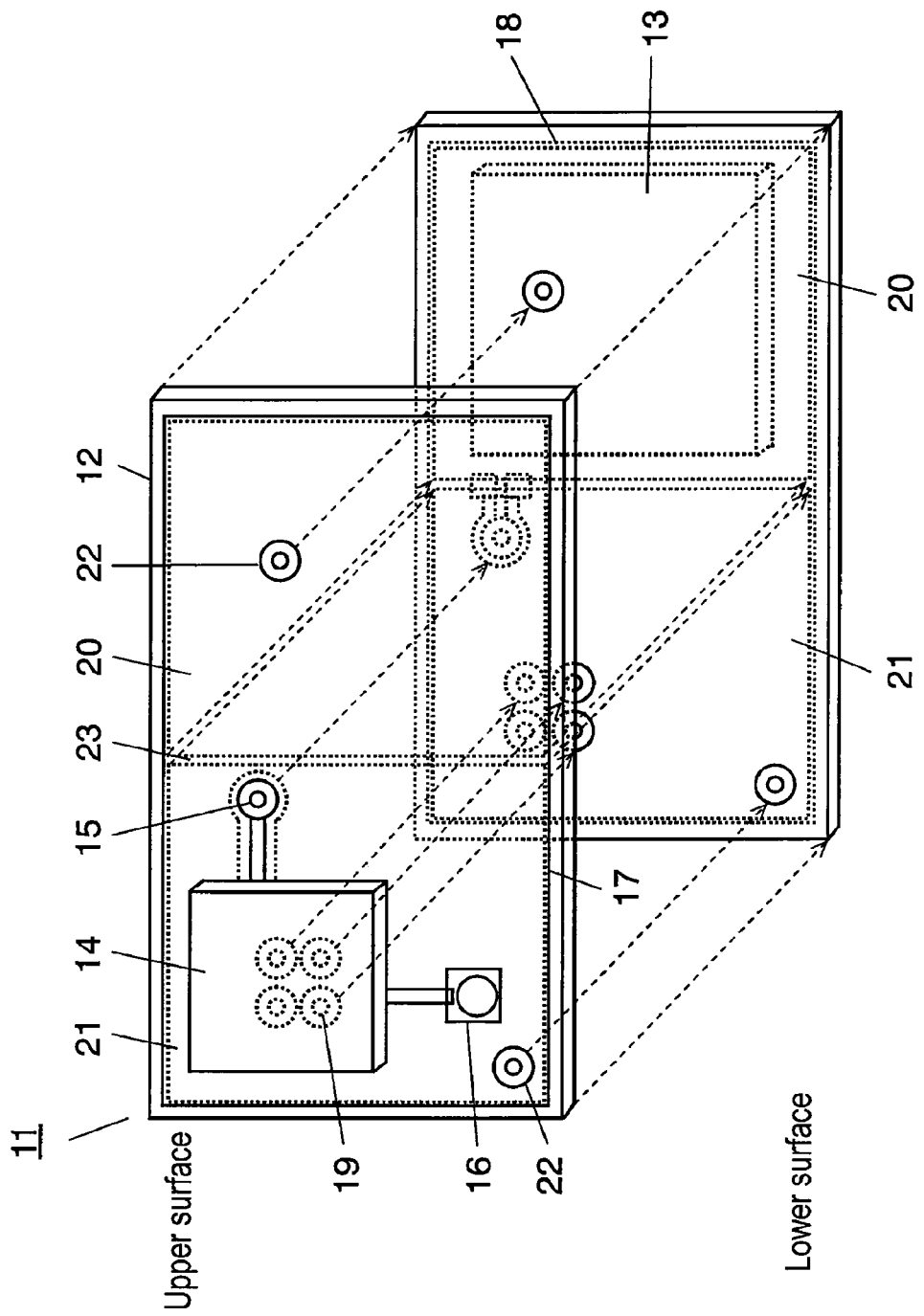
FIG. 1 is a view of upper and lower surfaces of a communication device according to a first embodiment of the present invention.

REFERENCE MARKS IN THE DRAWINGS 11 communication device
12 board
13 semiconductor circuit
14 amplifier
15 via
16 antenna terminal
17 ground plane
18 ground plane
19 thermal via
20 first ground region
21 second ground region
22 ground via
23 first high-impedance region
26 first connector ground plane
27 transmitter-receiver circuit ground region
28 digital ground region
29 second high-impedance ground region
32 second connector ground plane
33 spacer board
34 shield case
35 mother board
36 CPU
37 interface bus
38 antenna

DETAILED DESCRIPTION OF PREFERRED EMBODIMENTS

First Embodiment

A first embodiment of the present invention is described as follows with reference to FIGS. 1 and 2.

Figure 2:
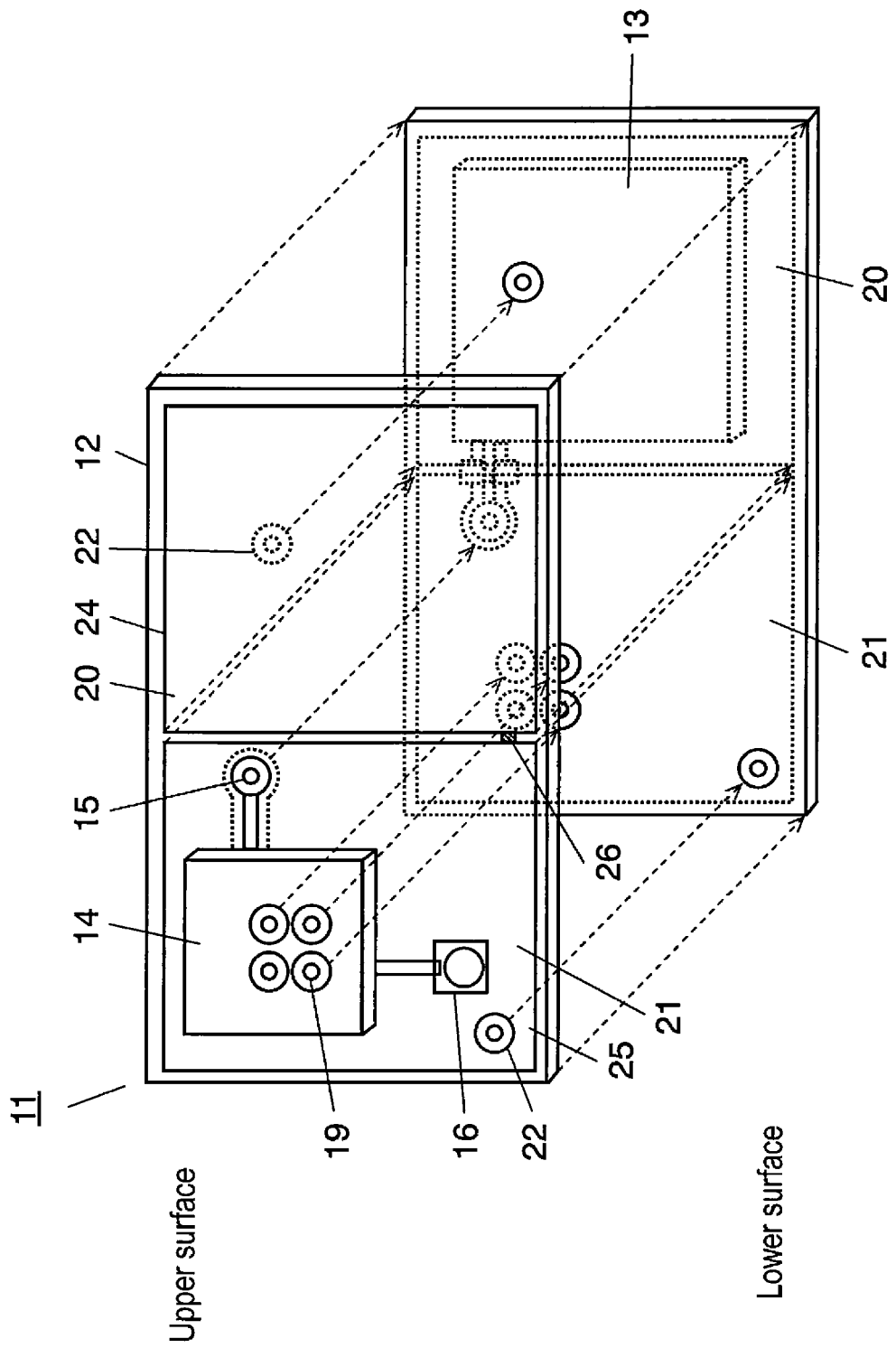
FIG. 2 is another view of the upper and lower surfaces of the communication device according to the first embodiment of the present invention.

FIGS. 1 and 2 are views of the upper and lower surfaces of a communication device according to the first embodiment of the present invention. In FIG. 1, communication device 11, which may be a chip type, is connected to an electronic apparatus (not illustrated) such as a personal computer or a portable telephone for wireless LAN or other wireless communications. Communication device 11 includes board 12, semiconductor circuit 13, amplifier 14, and antenna terminal 16. Semiconductor circuit 13 is disposed on the lower surface of board 12. Amplifier 14 is disposed on the upper surface of board 12 and connected to semiconductor circuit 13 through via 15. Antenna terminal 16 is disposed on the upper surface of board 12 and connected to the output of amplifier 14.

Board 12 is a multilayer board of square or other shapes. The multilayer board is made of resin such as glass epoxy resin and has a thickness of not more than 0.5 mm. Board 12 includes ground planes 17 and 18. Ground plane 17 is disposed on the upper surface of board 12 and connected to amplifier 14. Ground plane 18 is disposed inside board 12 and connected to semiconductor circuit 13. Ground planes 17 and 18 are electrically connected to each other through ground via 22 formed inside board 12.

Semiconductor circuit 13 for generating transmission signals is a large-scale integrated circuit fabricated by CMOS process. Semiconductor circuit 13 is connected to more than 200 signal lines disposed inside board 12.

Amplifier 14 amplifies the transmission signals generated by semiconductor circuit 13. Amplifier 14 is connected to ground planes 17 and 18 through thermal vias 19 for diffusing the heat generated by amplifier 14. Amplifier 14 is an integrated circuit fabricated by compound semiconductor process.

Antenna terminal 16 is formed of a connector, a throughhole of board 12, and conductive material such as solder. Antenna terminal 16 supplies transmission signals to an antenna (not illustrated) placed at the output thereof.

Ground plane 18 includes first ground region 20 connected to semiconductor circuit 13. Ground plane 17 includes second ground region 21, which is disposed under amplifier 14 and connected thereto. First and second ground regions 20 and 21 do not overlap with each other when viewed from above board 12.

With this structure, first ground region 20 connected to semiconductor circuit 13 and second ground region 21 connected to amplifier 14 are separated from each other. This ensures a sufficient number of thermal vias 19 to be connected to amplifier 14 without being hindered by signal lines of semiconductor circuit 13. As a result, there is little floating inductance between amplifier 14 and ground planes 17, 18, thereby reducing abnormal oscillation of amplifier 14. The sufficient number of thermal vias 19 can sufficiently radiate amplifier 14, thereby decreasing the gain reduction of amplifier 14 due to self heating. This stabilizes the transmission characteristics of amplifier 14.

Since amplifier 14 and semiconductor circuit 13 are disposed on the opposite surfaces of the board, the low-frequency noise generated in semiconductor circuit 13 is prevented from entering amplifier 14.

Ground planes 17 and 18 may include first high-impedance region 23 between first and second ground regions 20 and 21. First high-impedance region 23 has a higher impedance value than first and second ground regions 20 and 21.

As shown in FIG. 2, first high-impedance region 23 of FIG. 1 can be implemented as first connector ground plane 26, which is smaller in width than ground plane 24 including first ground region 20 and ground plane 25 including second ground region 21. First connector ground plane 26 connects ground plane 24 including first ground region 20 and ground plane 25 including second ground region 21. First connector ground plane 26 has the effect of making ground plane 24 including first ground regions 20 and ground plane 25 including second ground regions 21 short circuits at DC and open circuits at high frequencies. This prevents the low-frequency noise generated in semiconductor circuit 13 from entering amplifier 14.

Amplifier 14 and antenna terminal 16 are preferably disposed on the same side of board 12. In this case, signals do not pass through the vias for electrically connecting the upper and lower surfaces of board 12 in the transmission line, thereby reducing transmission loss.

Alternatively, amplifier 14 and antenna terminal 16 may be disposed on different sides of board 12. In this case, transmission signals amplified by amplifier 14 are suppressed from bonding to antenna terminal 16.

Communication device 11, which has been described as a transmission device, may alternatively be a receiving device.

Second Embodiment

A second embodiment of the present invention is described as follows with reference to FIGS. 3 and 4. Like components are labeled with like reference numerals with respect to the first embodiment, and hence the description thereof will be omitted. The following description is focused on the difference between the first and second embodiments.

Figure 3:
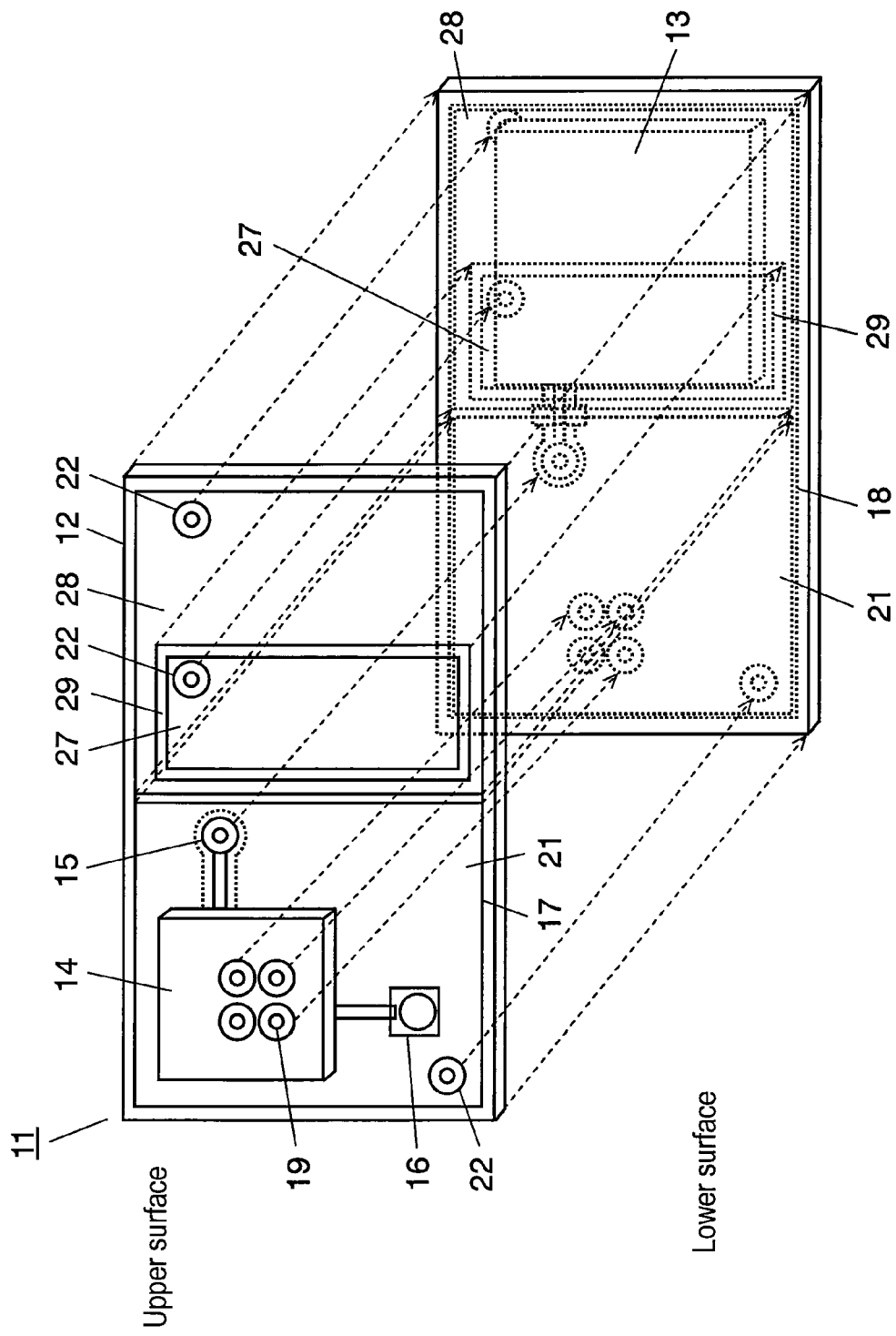
FIG. 3 is a view of upper and lower surfaces of a communication device according to a second embodiment of the present invention.
Figure 4:
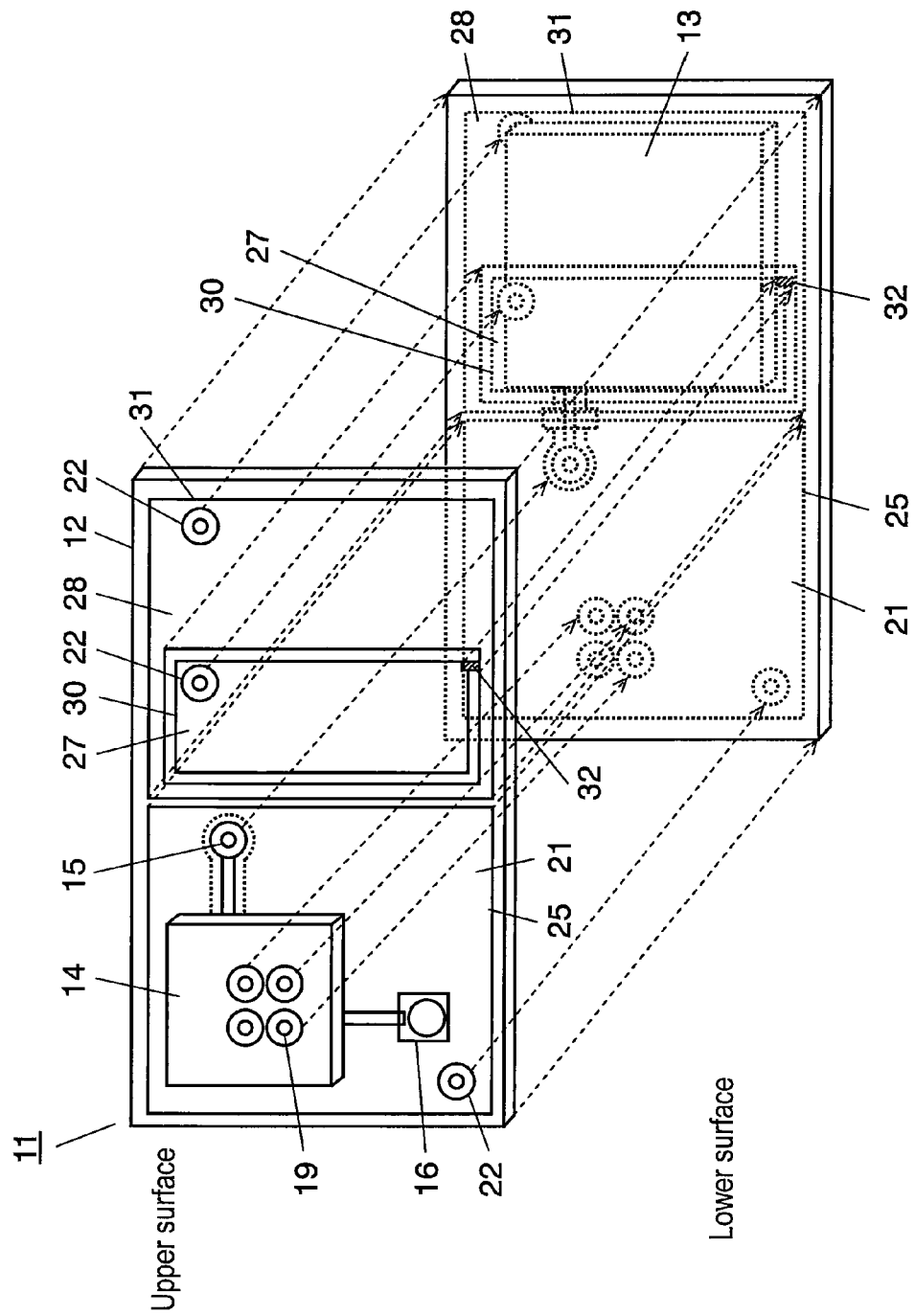
FIG. 4 is another view of the upper and lower surfaces of the communication device according to the second embodiment of the present invention.

FIGS. 3 and 4 are views of the upper and lower surfaces of a communication device according to the second embodiment of the present invention. As shown in FIG. 3, semiconductor circuit 13 includes a transmitter-receiver circuit of RF band (2.4 GHz band or 5 GHz band) used for wireless LAN, and a digital circuit such as a signal processing circuit or a MAC (Media Access Control) circuit for wireless LAN.

Ground planes 17 and 18 include transmitter-receiver circuit ground region 27 and digital ground region 28. Transmitter-receiver circuit ground region 27 is disposed under the transmitter-receiver circuit of RF band in semiconductor circuit 13. Digital ground region 28 is disposed under the digital circuit. Ground planes 17 and 18 are disposed between transmitter-receiver circuit ground region 27 and digital ground region 28. Ground planes 17 and 18 further include second high-impedance ground region 29, which has a higher impedance value than transmitter-receiver circuit ground region 27 and digital ground region 28.

In FIG. 4, second high-impedance ground region 29 of FIG. 3 can be implemented as second connector ground plane 32, which is smaller in width than ground plane 30 including transmitter-receiver circuit ground region 27 and ground plane 31 including digital ground region 28. Second connector ground plane 32 connects ground plane 30 including transmitter-receiver circuit ground region 27 and ground plane 31 including digital ground region 28. Second connector ground plane 32 has the effect of making ground plane 30 including transmitter-receiver circuit ground region 27 and ground plane 31 including digital ground region 28 short circuits at DC and open circuits at high frequencies. This prevents the low-frequency noise generated in the digital circuit from entering the transmitter-receiver circuit.

Third Embodiment

A third embodiment of the present invention is described as follows with reference to FIG. 5. Like components are labeled with like reference numerals with respect to the first embodiment, and hence the description thereof will be omitted. The following description is focused on the difference between the first and third embodiments.

Figure 5:
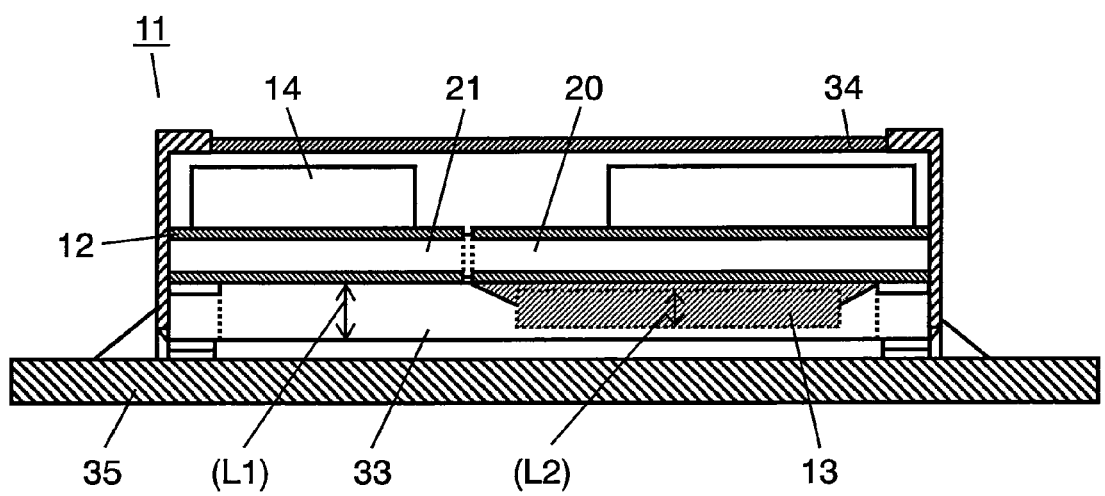
FIG. 5 is a sectional view of a communication device according to a third embodiment of the present invention.

FIG. 5 is a sectional view of a communication device according to the third embodiment of the present invention.

As shown in FIG. 5, the communication device includes spacer board 33, which is made of resin such as glass epoxy resin and disposed along the periphery of the lower surface of board 12.

Spacer board 33 has a height (L1), which is larger than a component height (L2) of semiconductor circuit 13. This protects semiconductor circuit 13, thereby improving the connection reliability between semiconductor circuit 13 and board 12.

The communication device also includes shield case 34 disposed over board 12 in such a manner as to cover electronic components (not illustrated) including amplifier 14 and to fix the ends of board 12 and the ends of spacer board 33. The electronic components include resistors, capacitors, and coils besides amplifier 14. This improves the connection reliability between board 12 and spacer board 33. When communication device 11 is mounted on mother board 35, it is possible to solder shield case 34 thereon.

Fourth Embodiment

A fourth embodiment of the present invention is described as follows with reference to FIG. 6. Like components are labeled with like reference numerals with respect to the first embodiment, and hence the description thereof will be omitted. The following description is focused on the difference between the first and fourth embodiments.

Figure 6:
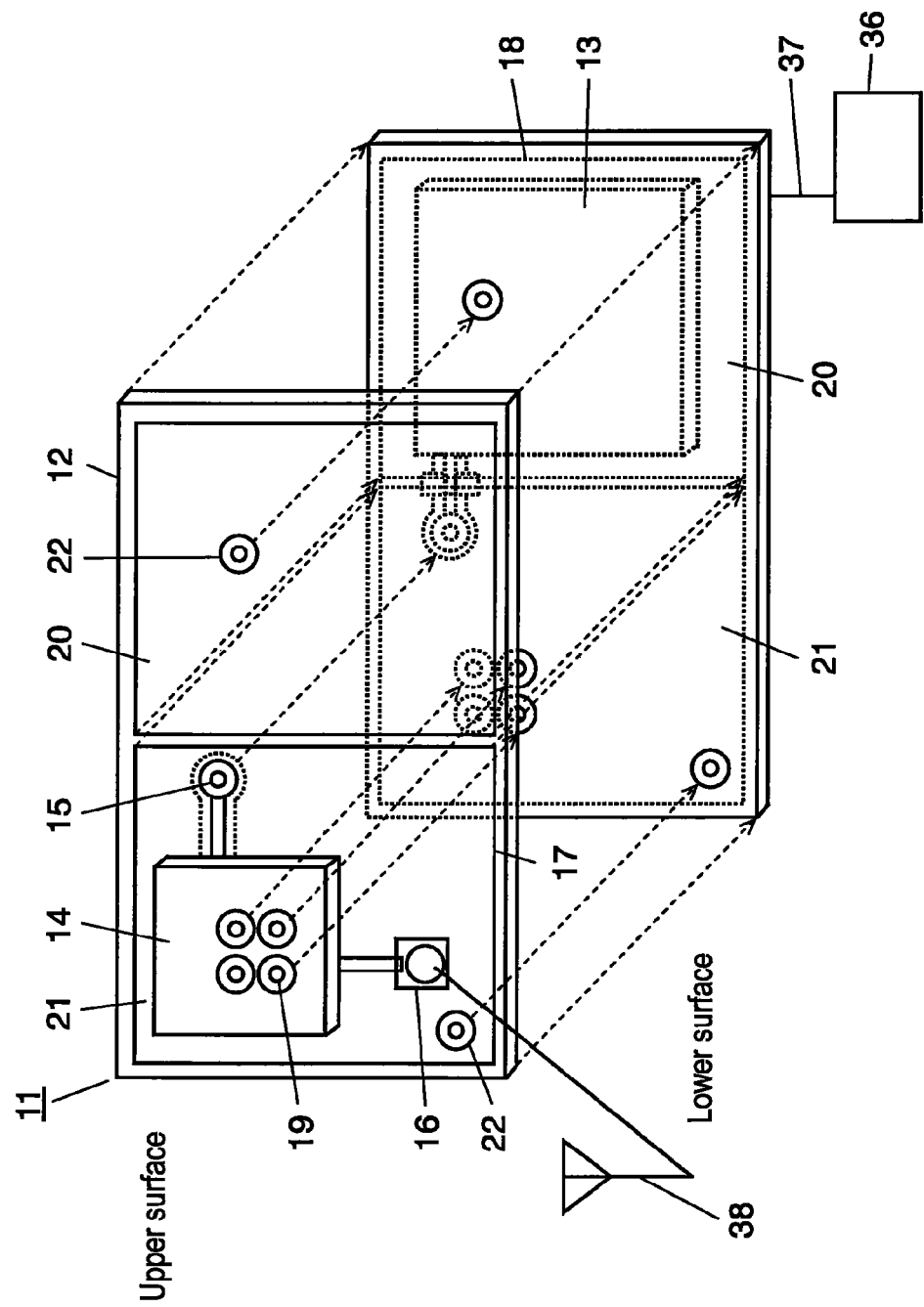
FIG. 6 is a view of upper and lower surfaces of a communication device and an electronic apparatus using the device according to a fourth embodiment of the present invention.

FIG. 6 is a view of the upper and lower surfaces of a communication device and an electronic apparatus using the device according to the fourth embodiment of the present invention. As shown in FIG. 6, communication device 11 is connected to a microcomputer including CPU 36 through interface bus 37. Antenna terminal 16 is connected to antenna 38.

With this structure, communication device 11 can be controlled by CPU 36 of the electronic apparatus, thereby implementing an electronic apparatus using the communication device with improved transmission characteristics of any of the first to third embodiments.

INDUSTRIAL APPLICABILITY

The communication device of the present invention can reduce abnormal oscillation of an amplifier, thereby being useful to electronic apparatuses for portable terminals or to be mounted on vehicles.

The invention claimed is:

1. A communication device comprising:
a board including at least one ground plane therein;
an amplifier disposed on the board; and
a semiconductor circuit disposed under the board and connected to the amplifier, wherein
the at least one ground plane includes:
a first ground region connected to the amplifier; and
a second ground region connected to the semiconductor circuit, the first ground region and the second ground region not overlapping with each other.

2. The communication device of claim 1, wherein
the at least one ground plane includes a first high-impedance ground region disposed between the first ground region and the second ground region, the first high-impedance ground region having a higher impedance value than the first ground region and the second ground region.

3. The communication device of claim 2, wherein
the at least one ground plane includes a first connector ground plane smaller in width than the first ground region and the second ground region.

4. The communication device of claim 1, wherein
the semiconductor circuit includes a digital circuit for processing digital signals;
the at least one ground plane includes:
a digital ground region connected to the digital circuit; and
a second high-impedance ground region disposed between the first ground region and the digital ground region, the second high-impedance ground region having a higher impedance value than the first ground region and the digital ground region.

5. The communication device of claim 2, wherein
the at least one ground plane includes a second connector ground plane smaller in width than the first ground region and the digital ground region.

6. The communication device of claim 1, further comprising:
a spacer board disposed along a periphery of a lower surface of the board and larger in height than the semiconductor circuit.

7. The communication device of claim 6, further comprising:
a shield case disposed over the board in such a manner as to cover electronic components including the amplifier, the shield case being connected to the board and the spacer board.

8. An electronic apparatus comprising:
a board including at least one ground plane therein;
an amplifier disposed on the board;
a semiconductor circuit disposed under the board and connected to the amplifier;
an antenna; and
a signal processing circuit, wherein
the antenna is connected to an output of the semiconductor circuit,
the signal processing circuit is connected to an input of the semiconductor circuit, and
the at least one ground plane includes:
a first ground region connected to the amplifier; and
a second ground region connected to the semiconductor circuit, the first ground region and the second ground region not overlapping with each other.

* * * * *